United States Patent [19]

Kadono et al.

[11] Patent Number: 5,299,681
[45] Date of Patent: Apr. 5, 1994

[54] CONVEYOR EQUIPMENT

[75] Inventors: Nobuaki Kadono; Daisaku Kugo; Masatoshi Kajiwara; Ryuji Yamakawa, all of Nagaokakyo, Japan

[73] Assignee: Murata Manufacturing Co., Ltd., Japan

[21] Appl. No.: 875,378

[22] Filed: Apr. 29, 1992

[30] Foreign Application Priority Data

Apr. 30, 1991 [JP] Japan .................. 3-126598
Sep. 21, 1991 [JP] Japan .................. 3-270400

[51] Int. Cl.⁵ .............................. B65G 15/58
[52] U.S. Cl. ..................... 198/690.1; 198/472.1; 198/792; 198/803.6; 198/805
[58] Field of Search ............ 198/472.1, 690.1, 803.6, 198/805, 812, 792

[56] References Cited

U.S. PATENT DOCUMENTS

| | | | |
|---|---|---|---|
| 3,941,242 | 3/1976 | Braden | 198/803.6 |
| 4,544,060 | 10/1985 | Enomoto | 198/495 |
| 4,565,284 | 1/1986 | Seragnoli et al. | 198/792 |
| 4,586,601 | 5/1986 | Hodlewsky | 198/690.1 |
| 4,735,032 | 4/1988 | Focke | 198/792 X |
| 4,925,012 | 5/1990 | Guntensperger | 198/690.1 |
| 4,954,207 | 9/1990 | Higuchi et al. | 156/552 |
| 5,165,527 | 11/1992 | Garbagnati | 198/690.1 X |

FOREIGN PATENT DOCUMENTS

| | | |
|---|---|---|
| 0120140 | 10/1984 | European Pat. Off. |
| 3427057 | 1/1986 | Fed. Rep. of Germany |
| 4114639 | 12/1992 | Fed. Rep. of Germany |
| 1032159 | 6/1966 | United Kingdom |
| 2177669 | 1/1987 | United Kingdom |

OTHER PUBLICATIONS

German book: A. Kuhlenkamp, Feinwerktechnik, vol. 3, Rowohlt, Jun. 1972, pp. 618–620.
German book: K.-H. Decker, Maschinenelemente, Karl-Hanser-Verlang München 1990, pp. 611–614.
German book: Dubbel, Taschenbuch für den Maschinenbau, Springer-Verlag 1970, pp. 620–624.

Primary Examiner—Cheryl L. Gastineau
Attorney, Agent, or Firm—Ostrolenk, Faber, Gerb & Soffen

[57] ABSTRACT

Retainer grooves are formed widthwise at a constant pitch on the external surface of a timing belt to retain the lead terminals of an electronic component therein. A magnet is mounted to a rail for guiding the timing belt to attract the lead terminals of the electronic component to the retainer grooves. The electronic component can be prevented from falling off or being displaced due to an inertia force generated at the time of intermittent feed so as to be stably conveyed not only horizontally but also in vertical or circular arc directions.

11 Claims, 9 Drawing Sheets

CONVEYOR EQUIPMENT

BACKGROUND OF THE INVENTION

The present invention relates to a conveyor apparatus for continuously conveying workpieces at a constant pitch, and more particularly to conveyor equipment suitable for carrying out a plurality of working processes in a production facility. Specifically, the present invention relates to a conveyor suitable for carrying out characteristic measurement, selection, taping, and other processes on a small workpiece such as an electronic component conveyed by means of an automatic mechanism.

Conventionally when producing a taped type electronic component whose wire type lead terminals are held on a base tape formed with notches beforehand, an electronic component element is attached to the lead terminals to complete the electronic component on the base tape as disclosed in U.S. Pat. No. 4,954,207. Electronic components produced as described above are subjected to characteristic measurement and selection processes while being conveyed, held on the base tape, and further to a taping process. The above-mentioned method has the advantage that the electronic component is stably held on the base tape while being conveyed; however, since the electronic component cannot be removed directly upward from base tape, the taping operation is difficult and the base tape cannot be used again after the taping operation is completed.

After completing an electronic component having plate type lead terminals by attaching an electronic component element to lead terminals (lead frame) formed from a hoop material, the electronic component is separated from others and transferred to a conveyor. A base tape, as described above, cannot be used. In order to convey an electronic component with plate type lead terminals, a conveying method is used in which workpiece holders with recess portions opening upward are attached at a constant pitch to an endless chain, driven intermittently, and electronic components are put in each of these recess portions.

However, since the electronic component is merely put in, the recess portion of a workpiece holder, it can be displaced or fall off the workpiece holder due to an inertial force at the time of intermittent feed. Furthermore, when the electronic component is conveyed vertically or in a circular arc direction, the electronic component cannot be prevented from being displaced or falling off the workpiece holder. For the above reasons, the workpiece conveyance direction is limited to almost horizontal directions; this allows little latitude with regard to the workpiece conveyance direction.

Conventionally when a plurality of processes having different processing times are included in a production facility, the processing speed of the entire production facility is generally adjusted to the process requiring the longest time. Therefore, another process requiring a short processing time cannot start its operation until the process requiring the longest processing time is completed; this results in slow processing speed and low efficiency of the entire production facility. Particularly when processing times of processes differ extremely, the above-mentioned problem becomes much more acute.

Furthermore, in view of the recent growing trend of multi-sort small-quantity production, when a component requiring a different processing time is transferred to the production facility line, or when the processing time of the process requiring the longest processing time is changed, the processing time of the entire production facility must be changed; this results in requiring a significant amount of time for adjustment procedures.

SUMMARY OF THE INVENTION

Accordingly, it is an object of the present invention to provide conveyor equipment which is capable of stably conveying a workpiece at high speed and allows flexibility in the workpiece conveyance direction.

Another object of the present invention is to provide conveyor equipment which is capable of increasing the processing speed of an entire production facility, and permits a simple, space-saving construction.

Still another object of the present invention is to provide conveyor equipment capable of easily coping with change in the processing time of each process.

Accordingly, an advantageous embodiment of the present invention provides an endless conveyor which retains and conveys workpieces which include a magnetic portion. The workpieces are conveyed one by one at a constant pitch. The retaining means retains thereon a magnetic portion of the workpiece, and correctly positions the direction in the workpiece conveyance. When the conveyance means is driven intermittently at a pitch, determined by a drive means, the workpiece, is prevented from being displaced in the direction of conveyance by the retaining means. Though the retaining means does not retain the workpiece in a direction perpendicular to the plane in which the workpiece is conveyed, the workpiece is prevented from being lifted off of the retaining means by magnetic means attracting the magnetic portion of the workpieces toward the retaining means.

The is attracted to the workpiece retaining means while being conveyed; therefore, the workpiece may be conveyed not only in a horizontal direction but also in a vertical or circular arc direction to allow greater latitude in the direction of conveyance. It is desirable that the attraction force of the magnet means is greater than the weight of the workpiece and sufficient to overcome any inertial force affecting the workpiece at the time of intermittent feed. Unlike an adhesive, the attraction force of the magnet means does not deteriorate even when used many times, nor does such force damage the workpiece as a mechanical clamp might. Furthermore, the retaining means does not clamp the workpiece in a direction perpendicular to the plane in which it is conveyed, allowing the workpiece to be easily loaded onto or unloaded from the retaining means.

When a radial-lead component is selected as a it is desirable that the workpiece conveyance means is a non-magnetic timing belt, and that the retaining means has retainer grooves, provided widthwise at a constant pitch on the external surface of the timing belt, to retain the lead terminals. When, as magnetic means, a permanent magnet is mounted to a rail for slidably guiding the timing belt, the permanent magnet exerts a magnetic force for attracting the workpiece toward the retaining means, thereby stably retaining the workpiece while it is being conveyed along the rail. The timing belt has internal teeth to be engaged with a drive pulley so that the workpiece is conveyed with a high degree of accuracy, in accordance with the drive pulley's rotatory angle. The timing belt is able to have a lighter-weight construction than any other workpiece conveyance means such as a chain; thus the entire conveyor is able to have a small inertial force and a high-speed conveyance capability together with a reduction of vibration and noise. Further, the timing belt is made of an elastic material such as rubber or polyurethane, so that any possible mechanical impact to the electronic component generated at the time of intermittent feed can be reduced thus causing little or no damage to the electronic component. The timing belt is also an insulating material suitable for characteristic measurement of the electronic component.

When a chain is selected as the workpiece conveyance means, it is desirable to mount workpiece holders to the chain at a constant pitch. In this configuration holders have both retainer grooves to retain the lead terminals of electronic components and permanent magnets to attract the lead terminals toward the retainer grooves. By means of the above described construction, the electronic components can be prevented from falling off or being displaced when they are conveyed intermittently, or when the workpiece conveyance direction is changed. In the case of the above-mentioned chain configuration when one of workpiece holders is damaged, it is only necessary to replace the damaged workpiece holder, while the other parts can be reused, thus permitting a repair cost reduction.

Furthermore, the present invention is provided with means for absorbing the pitch difference between adjoining processes while maintaining the tension of the endless conveyance means, i.e., buffer means, in order to increase the processing speed of the entire conveyor system.

For instance, when there are two processes having processing times differing by a factor of ten, the drive means of the short process is driven by 1-pitch, and the drive means of the long process may be driven by 10-pitch. Further, if the workpieces are processed one by one in the short process, workpieces may be processed in units of ten simultaneously in the long process. Furthermore, buffer means for absorbing the pitch difference of at least 10-pitch may be provided between the short-time process and the long-time process. In this way, a plurality of processes having different processing times can be integrated in one conveyance system, and the processing time of the entire system can be adjusted to the shortest process; thus a high-speed processing can be achieved. Furthermore, the conveyance means can be continuously driven without being slackened by virtue of the buffer means, thus further reducing the chance that the workpieces are displaced or fall off.

The buffer means can include a variety of modifications depending on the style of the conveyance means. When a radial-lead component is conveyed, retained in retainer grooves of the timing belt, it is desirable to mount a rotatable support pulley for supporting the internal surface of the timing belt, to a vertically movable lift member, and provide urging means for urging the lift member upward against the gravity force on the lift member. A spring or a weight having a gravity force greater than that of the lift member can be selected as the urging means. It is desirable to provide a pair of presser pulleys near both sides of the lift member in order to press down on the external surface of the timing belt, which is being lifted by the support pulley. Since this buffer means is constructed vertically, it can absorb a great difference in workpiece feed pitches in a small physical area. Therefore, two processes having a great difference in processing time can be arranged adjacent each other, with the result that a great latitude is allowed in regard of process arrangement.

The buffer means has a portion where the moving direction of the timing belt, i.e., the workpiece conveyance direction is vertical. When a workpiece is merely put on the timing belt it may fall off. Therefore, the timing belt is required to have a retaining means for retaining a workpiece at a constant pitch. When the includes a magnetic portion, the workpiece retaining means may be constructed by mounting a magnet to the timing belt or by providing a retainer groove in a nonmagnetic timing belt together with providing a magnet to a guide rail for the timing belt that attracts and retains the onto the timing belt. The workpiece retaining means may also be made of a rubber material and formed with a recess portion to elastically hold the entire body or a part of the workpiece in the recess portion. By providing retaining means as described above, the workpiece is stably conveyed and will not fall off the timing belt resulting in a great latitude being allowed in conveyance style.

Normally, when a workpiece requiring a different processing time is supplied to the production facility line or when the processing time is changed a mid-process, the process having a long processing time (requiring a great feed pitch) necessitates a large space in comparison with a process having a small processing time (requiring a small feed pitch); therefore, the total line arrangement must be changed. In the present embodiment, at least one drive means can be changeable in feed pitch and the drive means and buffer means can be shifted integrally in the conveyance direction by means of a shifting mechanism. Thus it is possible to readily cope with a change of processing time of the preceding and succeeding processes and to effectively utilize the spaces of the adjoining processes without changing the arrangement of the entire production facility line.

The shifting mechanism may be constructed by providing a guide mechanism for movably supporting the drive means and shifting the drive means in the conveyance direction manually or automatically by a motor, a cylinder, or like means.

DETAILED DESCRIPTION OF THE PREFERRED EMBODIMENTS

Figure 1A:
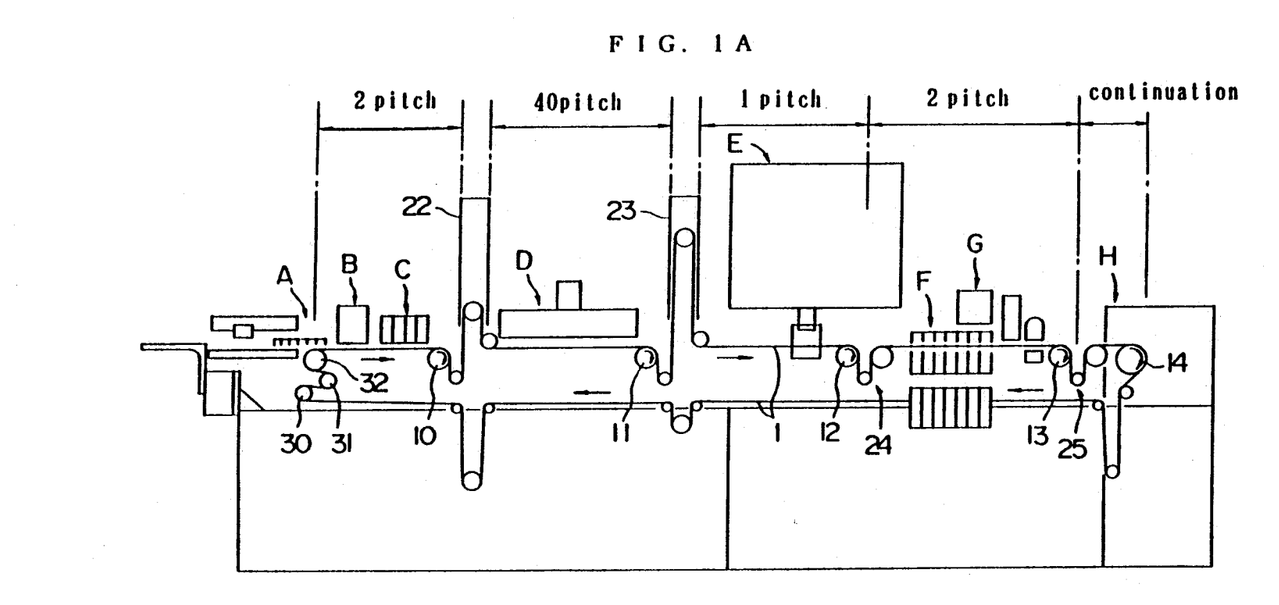
FIG. 1A is a schematic front view of a conveyor equipment in accordance with the present invention.
Figure 1B:
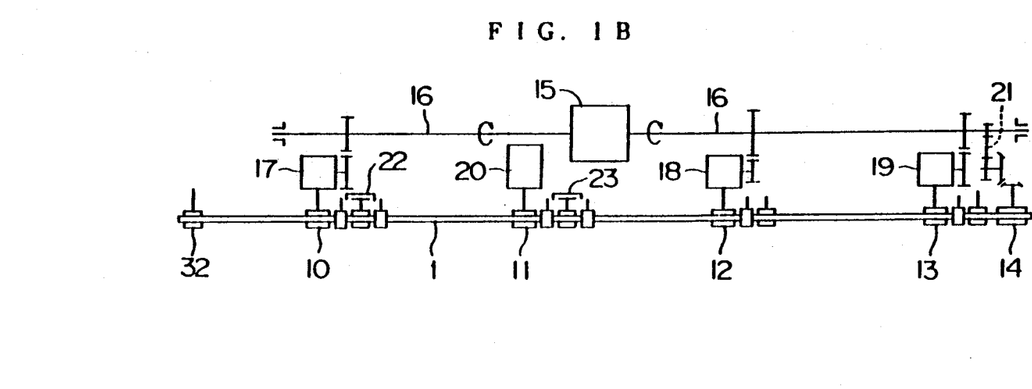
FIG. 1B is a plan view of the conveyor equipment in FIG. 1A.

FIG. 1A and FIG. 1B show schematic views of the entire system of a conveyor equipment in accordance with a first embodiment of the present invention.

The conveyor equipment comprises a workpiece receiving process A for receiving hoop-shaped lead frames with a plurality of electronic component elements from the preceding process, a separating process B for separating the electronic components from the hoop portion of the lead frame, measuring processes C and D for measuring the electric characteristics of the electronic components, a marking process E for printing marks on the electronic components by means of a laser marker or the like means, an NG (no-good) component removing process F for removing electronic components having deteriorated characteristics, a ranking process G for distributing the electronic components into several ranks, and a taping process H for taping the lead terminals of the electronic components.

Figure 2:
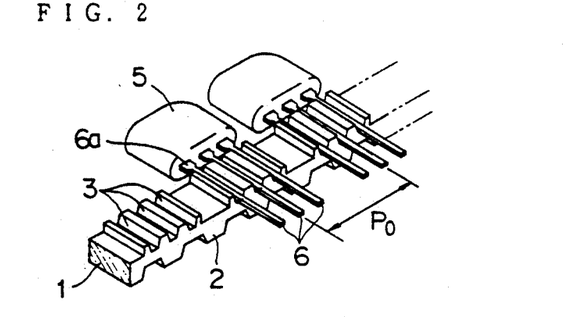
FIG. 2 is a perspective view of a timing belt in accordance with an embodiment of the present invention.

An endless timing belt 1 as shown in FIG. 2 is provided throughout the above-mentioned processes. The timing belt 1 is made of a non-magnetic rubber material and formed with internal teeth 2 provided at a constant pitch $P_0$ on the internal surface of the timing belt 1 and retainer grooves 3 which are grouped in units of three and provided widthwise at a constant pitch on the external surface of the timing belt 1. The retainer grooves 3 of each group are horizontally retaining three plate-type lead terminals 6 of a radial-lead type electronic component 5 selected as an object to be conveyed in the present invention.

The timing belt 1 is driven in a direction as indicated by the arrows in FIG. 1A. at different pitches by means of five drive pulleys 10 through 14. Among these drive pulleys, the pulleys 10, 12, and 13 are driven intermittently by a drive motor 15 via a shaft 16 and index heads 17 through 19, where the pulleys 10 and 13 are driven intermittently by 2-pitch ($2P_0$) while the pulley 12 is driven by 1-pitch ($1P_0$). The pulley 11 is driven intermittently by a pulse motor 20 by 40-pitch ($40P_0$) while the pulley 14 for the taping process is driven continuously by the drive motor 15 via the shaft 16 and a belt 21. Therefore, several processes having different feed pitches are included in one conveyor equipment in such way as follows: the timing belt is driven by 2-pitch at the workpiece receiving process A through the measuring process C, by 40-pitch at the measuring process D, by 1-pitch at the marking process E, by 2-pitch at the NG component removing process F and the ranking process G, and continuously at the taping process H. It is to be noted that the average driving speed of each process is identical.

Between adjoining processes having a great feed pitch difference, i.e., at the border sections between the measuring process C and the measuring process D as well as between the measuring process D and the marking process E, there are provided large-scale buffer means 22 and 23 for absorbing the great feed pitch difference of 40-pitch. Between adjoining processes having a small feed pitch difference, i.e., at the border sections between the marking process E and the NG component removing process F as well as between the ranking process G and the taping process H, there are provided small-scale buffer means 24 and 25 for absorbing the small feed pitch difference of 2-pitch.

The following describes the specific construction of the above-mentioned conveyor equipment.

Figure 3:
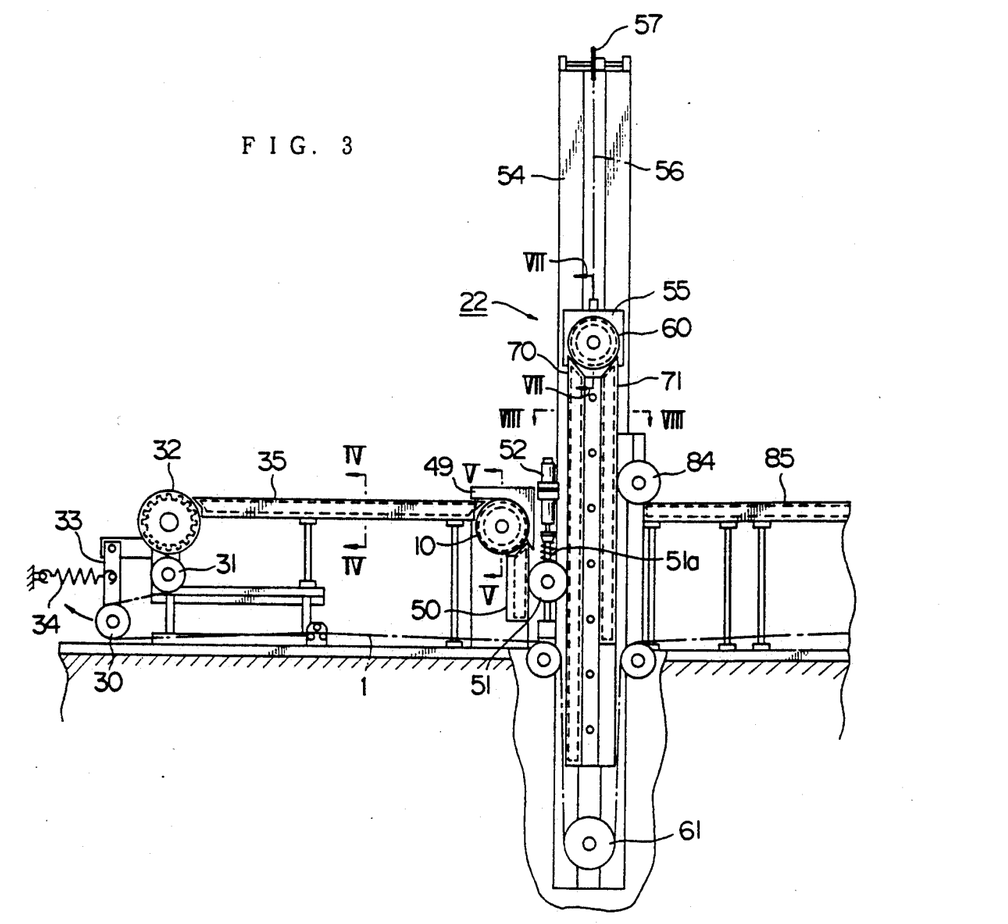
FIG. 3 is a front view of the commencing end of the conveyor equipment in FIG. 1A.
Figure 4:
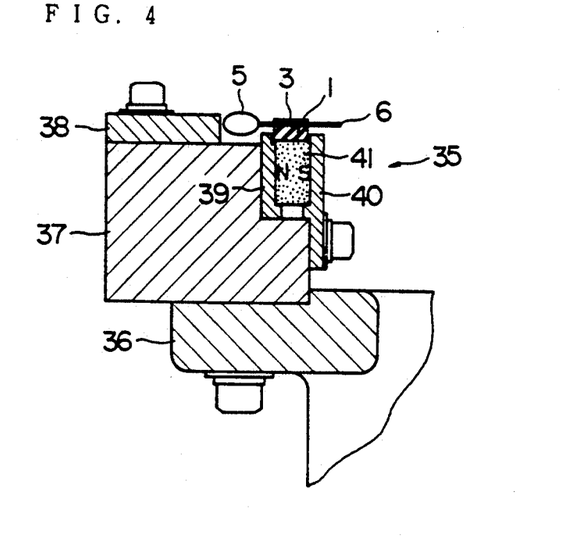
FIG. 4 is an enlarged section view of the conveyor equipment taken along the line IV—IV in FIG. 3.

At the commencing end of the conveyor equipment, there are provided three pulley units 30, 31, and 32 as shown in FIG. 3. The lowermost pulley 30 is suspended by an arm 33 being swingable forward and backward and urged by a spring 34 forward (in a direction as indicated by the arrow in FIG. 3), whereby a constant tension is applied to the returning portion of the timing belt 1. The returning portion of the timing belt 1 is guided from the pulley 30 via the intermediate pulley 31 and the toothed guide pulley 32 to the receiving process A, where a guide rail 35 having a construction as shown in FIG. 4 is provided horizontally. The rail 35 is constructed by fixing a non-magnetic rail guide 37 onto a mounting base 36 and further fixing thereon a non-magnetic head guide 38. Beside the rail guide 37, there are fixed two yokes 39 and 40 with interposition of a permanent magnet 41. The upper portions of the yokes 39 and 40 protrude slightly above the permanent magnet 41 so as to guide the timing belt 1 smoothly along a rail groove formed by the yokes 39 and 40 and the permanent magnet 41. The lead terminals 6 of an electronic component 5 retained in the retainer grooves 3 of the timing belt 1 are put close to the yokes 39 and 40 without contact. Therefore, a closed magnetic circuit is formed from the permanent magnet 41 via the yoke 39, lead terminals 6, yoke 40 to the permanent magnet 41, so that the lead terminals 6 are strongly attracted toward the retainer grooves 3. The yokes 39 and 40 concurrently serve as guide members for the timing belt 1 and as magnetic circuit forming members. The leftward movement of the electronic component 5 in FIG. 4 is checked by the head guide 38, while the rightward movement of the electronic component 5 is checked by widened portions 6a of the lead terminals 6 and a side edge of the retainer groove 3, thus the lateral displacement of the electronic component 5 is prevented.

Figure 5:
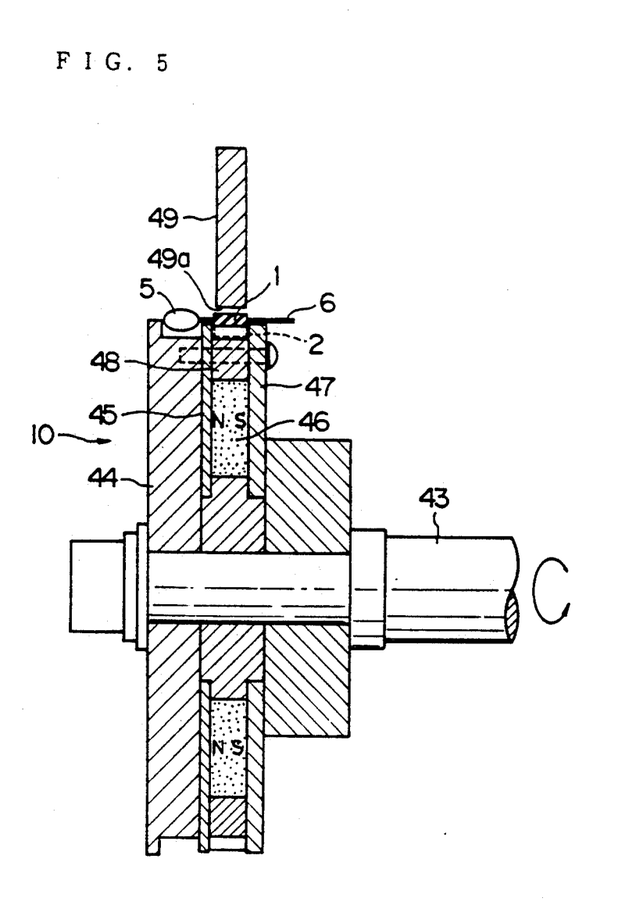
FIG. 5 is an enlarged section view of the conveyor equipment taken along the line V—V in FIG. 3.

At the hindmost end of the rail 35, there is provided a drive pulley 10 as shown in FIG. 5. The drive pulley 10 is provided with a drive shaft 43 which is driven intermittently by 2-pitch by the index head 17. On the drive shaft 43, there are successively fixed a non-magnetic head guide 44, a yoke 45, a permanent magnet 46, and another yoke 47. Meanwhile, a non-magnet sprocket 48 is fixed outside the periphery of the permanent magnet 46 between the yokes 45 and 47. The sprocket 48 is engaged with the internal teeth 2 of the timing belt 1 so as to rotatively drive the timing belt 1. A magnetic circuit is formed from the permanent magnet 46 via the yoke 45, lead terminals 6, and the yoke 47 to the permanent magnet 46, so that the electronic component 5 is retained stably in the retainer grooves 3 of the timing belt 1. Just above the drive pulley 10, there is a fixed guide plate 49 whose circular arc surface 49a guides the external surface of the timing belt 1, whereby the electronic component 5 is prevented from falling off or being displaced when the conveyance direction changes from straight into a circular arc direction. It is to be noted that since the other drive pulleys 11 through 13 have the same construction as that of the drive pulley 10, no description is presented for those pulleys herein.

The timing belt 1 which has passed through the drive pulley 10 is driven downward along a rail 50 (refer to FIG. 3) and then turned upward by a pressor pulley 51. The rail 50 has the same construction as that of the rail 35 shown in FIG. 4 so that the electronic component 5 conveyed downward is prevented from falling off the timing belt 1 by means of the attraction power of a permanent magnet. The pressor pulley 51 is continuously pushed downward by means of a spring 51a, absorbing, inertial force generated in the 40-spring pitch operation of the succeeding measuring process D, and preventing the timing belt 1 from overrunning. A shock absorber 52 is provided in order to elastically receive the upward movement of the pulley 51.

Figure 6:
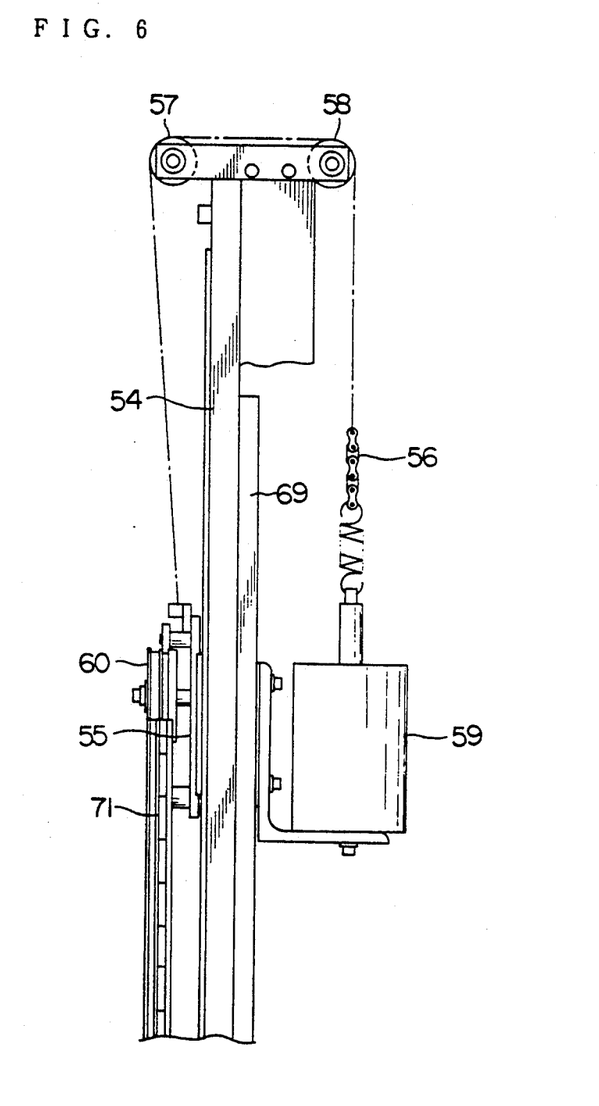
FIG. 6 is an enlarged right side view of the upper portion of buffer means.
Figure 7:
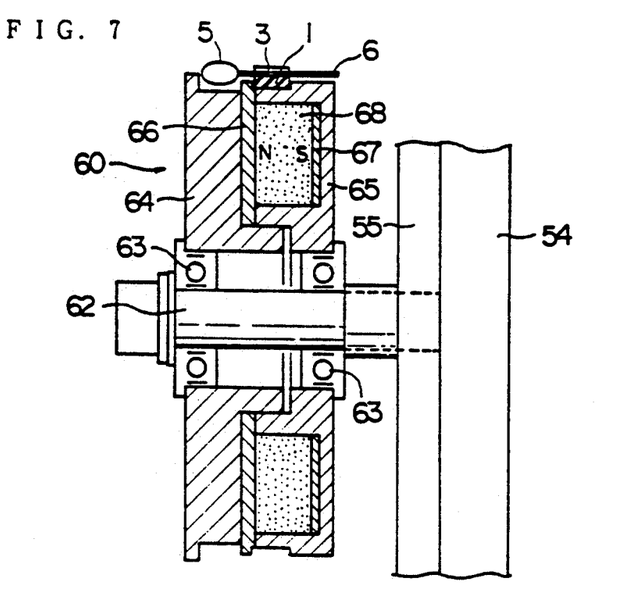
FIG. 7 is an enlarged section view of the conveyor equipment taken along the line VII—VII in FIG. 3.

A large-scale buffer means 22 comprises a pillar 54 standing upright and a lift member 55 attached vertically slidably on the front surface of the pillar 54. The upper end of the lift member 55 is connected to a chain 56 which is connected to a weight 59 provided behind the pillar 54 via two sprockets 57 and 58 mounted at the uppermost end of the pillar 54 as shown in FIG. 6. The weight 59 is fixed to a slide plate 69 attached vertically slidably on the back surface of the pillar 54. The weight 59 is designed to have a weight greater than the total weight of the lift member 55 including pulleys 60 and 61 and rails 70 and 71 as described in detail hereinafter, whereby the lift member 55 is continuously urged upward. At the uppermost and lowermost end portions of the lift member 55, there are provided rotatable support pulleys 60 and 61 respectively. On both sides of the lift member 55, there are fixed a pair of rails 70 and 71 extending vertically. As shown in FIG. 7, the upper support pulley 60 is rotatably mounted by a bearing 63 to a shaft 62 which is fixed to the lift member 55. The upper support pulley 60 has a non-magnetic head guide 64, a non-magnetic flange 65, yokes 66 and 67 and a permanent magnet 68 which is provided between the yokes 66 and 67, where the flange 65 and the yoke 66 form a groove for guiding the timing belt 1. Since the timing belt 1 is wound tightly around the pulley 60 due to the weight of the aforesaid weight 59, the timing belt 1 is guided by the flange 65 in order to prevent the permanent magnet 68 from being damaged. When the timing belt 1 moves around the support pulley 60, the lead terminals 6 of the electronic component 5 are stably retained in the retainer grooves 3 by a magnetic force exerted from the permanent magnet 68 so as to prevent the electronic component 5 from falling off the timing belt 1.

The lower pulley 61 is employed to apply downward tension to the returning portion of the timing belt 1, and it does not have such permanent magnet as provided in the upper pulley 60.

Figure 8:
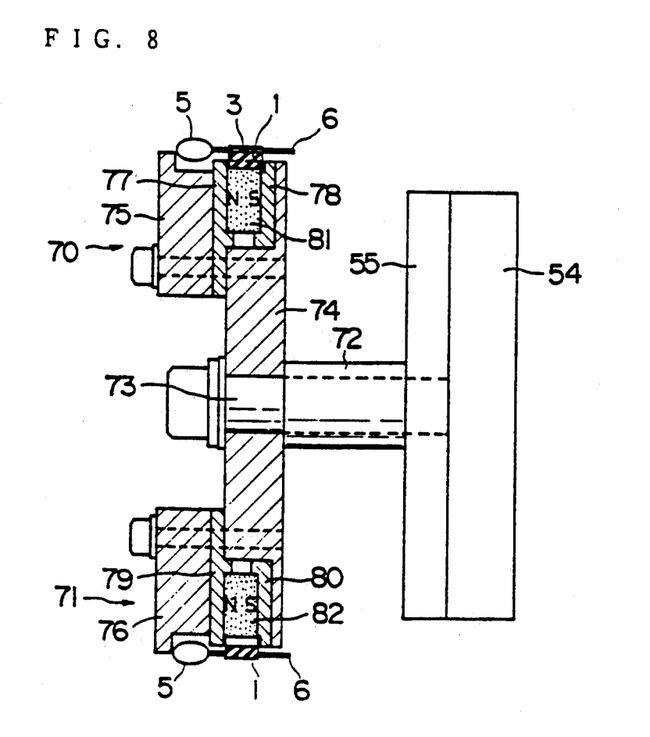
FIG. 8 is an enlarged section view of the conveyor equipment taken along the line VIII—VIII in FIG. 3.

As shown in FIG. 8, a non-magnetic rail guide 74 is fixed in front of the lift member 55 via a spacer 72 by means of a bolt 73, and the rails 70 and 71 are provided at both sides of the rail guide 74. The rail 70 has nonmagnetic head guide 75, yokes 77 and 78, and a permanent magnet 81 which is interposed between yokes 77 and 78, where a rail groove for guiding the timing belt 1 is formed by the yokes 77 and 78 and the permanent magnet 81. In the same manner, the rail 71 has head guide 76, yokes 79 and 80, and a permanent magnet 82. By the means of the above construction, when the timing belt 1 moves vertically along the rails 70 and 71, the lead terminals 6 of the electronic component 5 are retained stably in the retainer grooves 3 of the timing belt 1 by magnetic forces exerted from the permanent magnets 81 and 82. It is to be noted that the rail 70 has a length slightly greater than the rail 71.

Figure 9:
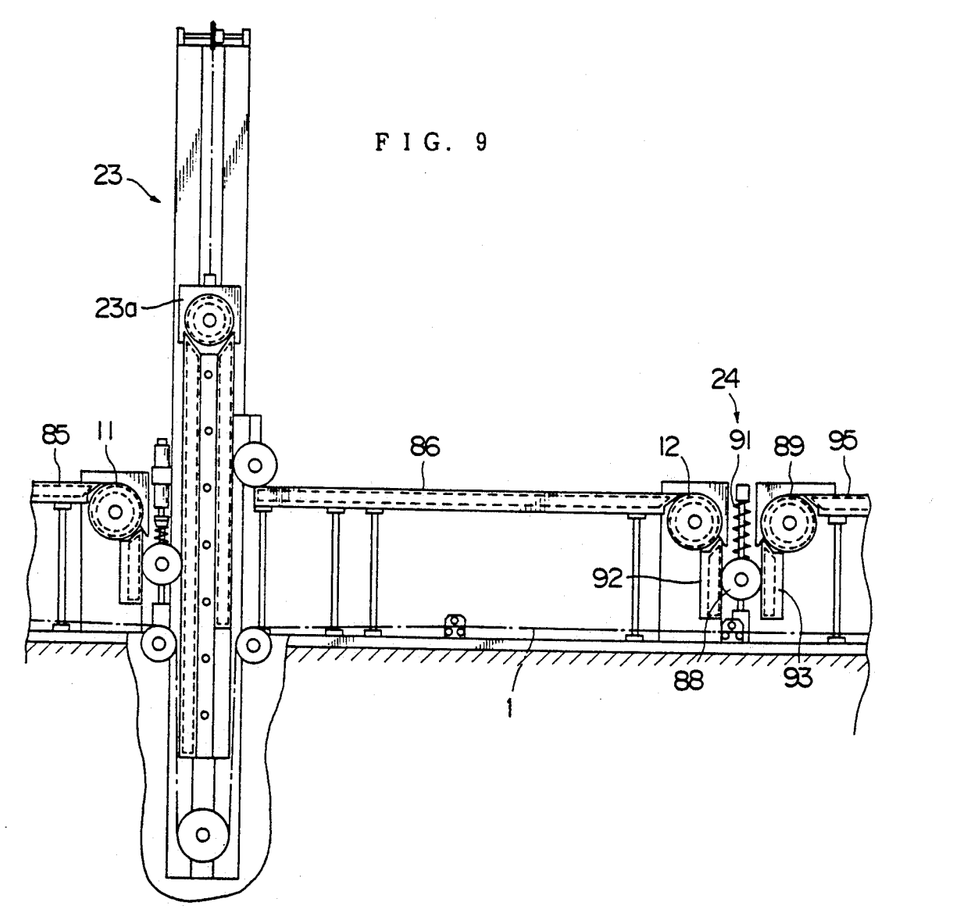
FIG. 9 is a front view of the middle portion of the conveyor equipment in FIG. 1A.
Figure 10:
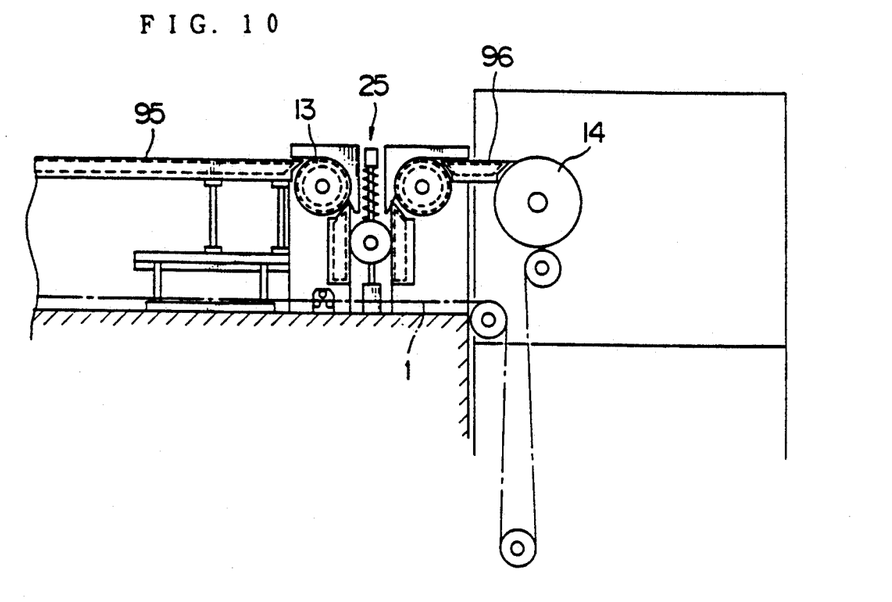
FIG. 10 is a front view of the terminating end portion of the conveyor equipment in FIG. 1A.

The timing belt 1 which has passed through the rail 71 of the buffer means 22 is guided into a horizontal direction by a pressor pulley 84 to be driven along a rail 85 through the measuring process D. The rail 85 has the same construction as the rail 35 shown in FIG. 4. After a measuring operation is completed, the timing belt 1 enters the marking process E via buffer means 23 as shown in FIG. 9. The buffer means 23 has the same construction as that of the above-mentioned buffer means 22, thus no description is presented for the buffer means 23 herein.

The timing belt 1 is fed by 2-pitch before the buffer means 22, by 40-pitch between the buffer means 22 and the buffer means 23, and by 1-pitch after the buffer means 23. Therefore, just before the drive pulley 11 carries out a 40-pitch operation, the buffer means 22 (lift member 55) is positioned at the uppermost end thereof, and the buffer means 23 (lift member 23a) is positioned at the lowermost end thereof. When the drive pulley 11 starts to operate, the buffer means 22 moves up, and the backward buffer means 23 moves down, simultaneously. When the 40-pitch operation is completed, the buffer means, 22 becomes positioned at the lowermost end thereof, and the buffer means 23 becomes positioned at the uppermost end thereof. As the drive pulley 11 stops, the buffer means 22 moves up gradually applying a certain tension force to the timing belt 1 fed from the measuring process C by 2-pitch, and the buffer means 23 moves down gradually feeding the timing belt 1 toward the marking process E by 1-pitch. In this way, the two buffer means 22 and 23 move in opposite directions to absorb the feed pitch differences.

Throughout the marking process E, the timing belt 1 is fed by 1-pitch along the rail 86 by the drive pulley 12. The drive pulley 12 has the same construction as the pulley 10 shown in FIG. 5, and the rail 86 has the same construction as the rail 35 shown in FIG. 4. After the marking process E, small-scale buffer means 24 as shown in FIG. 9 is provided before the NG component removing process F. This buffer means 24 comprises a rotatable buffer pulley 88 located below the drive pulley 12 and a guide pulley 89 located at the same level as the drive pulley 12. The buffer pulley 88 is vertically movable while being urged downwardly by a spring 91. Therefore, the buffer pulley 88 can absorb the pitch difference while keeping the tension of the timing belt 1. Forward and backward of the buffer pulley 88, there are provided a pair of vertical rails 92 and 93 having a permanent magnet in the same manner as the rail 35 shown in FIG. 4. In combination with the magnet rails 92 and 93 prevent the electronic component 5 from falling off when the timing belt 1 passes through the buffer means 24.

As shown in FIG. 1A, after passing through the buffer means 24, the timing belt 1 is fed by 2-pitch from the NG component removing process E to the ranking process G along a rail 95 which has the same construction as the rail 35 shown in FIG. 4. At the hindmost end portion of the rail 95, there is provided small-scale buffer means 25 having the same construction as that of the buffer means 24. After passing through the buffer means 25, the timing belt 1 is continuously fed into the taping process H via a rail 96 which has the same construction as the rail 35 shown in FIG. 4.

In the taping process H, the electronic component 5 is transferred from the timing belt 1 to the taping pulley 14 to be subject to a taping process between the taping pulley 14 and another pulley (not shown). The timing belt 1 having released the electronic component 5 passes through the lower portion of the conveyor equipment to return to the commencing end.

Figure 11:
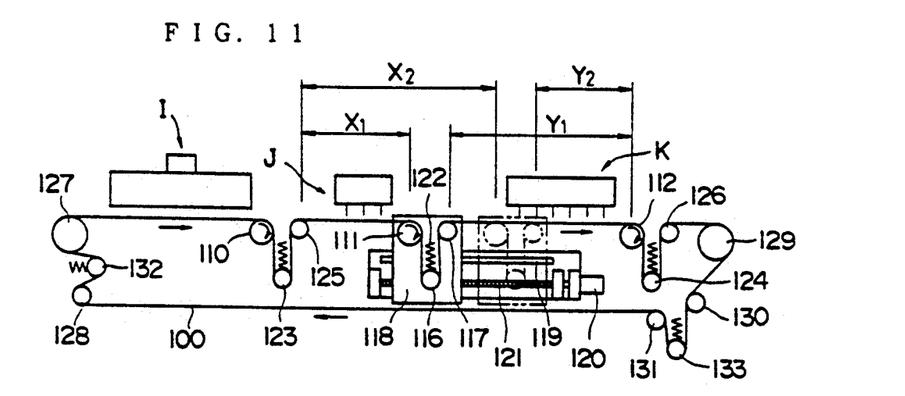
FIG. 11 is a schematic front view of a conveyor equipment in accordance with a second embodiment of the present invention.
Figure 12:
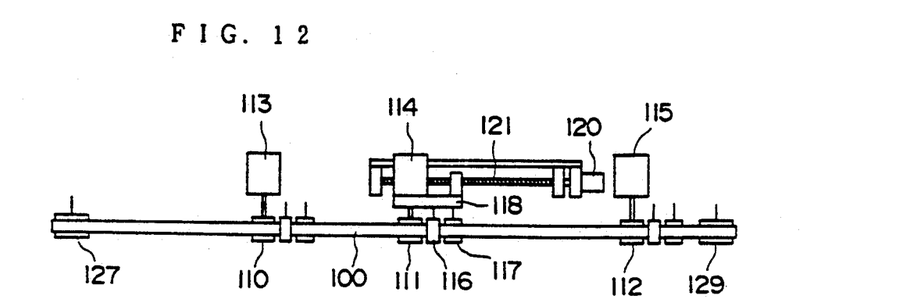
FIG. 12 is a plan view of the conveyor equipment in FIG. 11.

FIGS. 11 and 12 show schematic views of a conveyor equipment in accordance with a second embodiment of the present invention.

Figure 13:
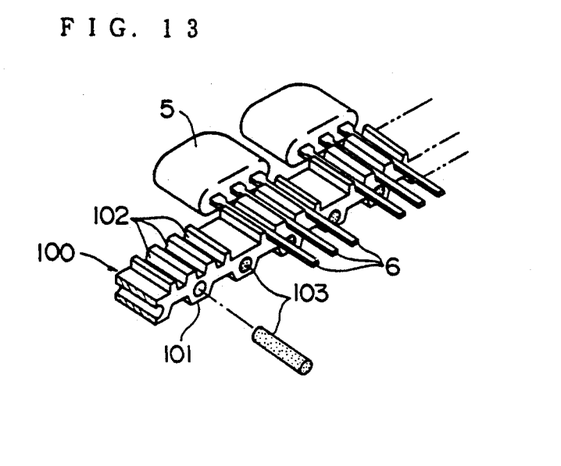
FIG. 13 is a perspective view of a timing belt and a workpiece in accordance with the second embodiment of the present invention.

The conveyor equipment comprises a first process I, a second process J and a third process K for carrying out prescribed processes on a workpiece of radial-lead type electronic component 5. As shown in FIG. 13, an endless timing belt 100 is employed throughout the above-mentioned processes. This timing belt 100 is made of a non-magnetic rubber material and formed with internal teeth 101 provided at a constant pitch on the internal surface thereof, and retainer grooves 102 which are grouped in units of three and provided widthwise, at a certain pitch on the external surface thereof. In FIG. 13, the retainer grooves 102 are horizontally retaining three plate-type lead terminals 6 of an electronic component 5. Rod shaped permanent magnets 103 are embedded widthwise inside the internal teeth 101 in order to attract the lead terminals 6 toward the retainer grooves 102. Due to the above construction, even when the workpiece conveyance direction is vertical, the electronic component 5 are prevented from falling off the timing belt 100. Furthermore, there is no need to mount any magnet to relevant pulleys or rails; thus simplified constructions of the conveyor equipment and buffer means are permitted.

The timing belt 100 is driven by three drive pulleys 110, 111, and 112 at different pitches in the direction as indicated by the arrows in FIG. 11. Among these pulleys, the first drive pulley 110 is always driven by a motor 113 at a constant pitch, while the second and third drive pulleys 111 and 112 are driven by motors 114 and 115 being capable of varying feed pitches respectively. Particularly the second drive pulley 111 is installed on a movable plate 118 together with buffer pulley 116 and guide pulley 117. The movable plate 118 is guided slidably horizontally by a guide rail 119 and is horizontally movable by means of a motor 120 and a ball screw 121 which constitute a shifting mechanism. The buffer pulley 116 is movable vertically while being urged downwardly by urging means 122 such as a spring or a weight in order to absorb the feed pitch difference between the preceding and succeeding processes of the drive pulley 111. The guide pulley 117 is provided to change the feed direction of the timing belt 100 into horizontal direction after passing through the buffer pulley 116.

Just after the first and third drive pulleys 110 and 112, there are also provided buffer pulleys 123 and 124 and guide pulleys 125 and 126 respectively. At the forward and backward end portions of the conveyor equipment, there are provided guide pulleys 127, 128, 129, 130, and 131 and tension pulleys 132 and 133 so as to apply a certain tension force to the returning portion of the timing belt 100.

The following describes the operation of the conveyor equipment having the above-mentioned construction. Supposing that the second process J has the shortest processing time, the processing time of the first process I is four times as long as that of the process J and the processing time of the third process K is two times as long as that of the process J. The timing belt 100 is driven by 4-pitch in the first process I, by 1-pitch in the second process J, and by 2-pitch in the third process K. At the same time, workpieces 5 are processed in units of four simultaneously in the process I, one by one in the process J and in units of two simultaneously in the process K. All the processes can be synchronized so as to increase the processing speed of the entire conveyor system. The feed pitch difference between the processes I and J is absorbed by the buffer pulley 123, the feed pitch difference between the processes J and K is absorbed by the buffer pulley 116, and the feed pitch difference between the processes K and I is absorbed by the buffer pulley 124.

Assume that the feed pitch of the second process J is changed from 1-pitch into 2-pitch and the feed pitch of the third process K is changed from 2-pitch into 1-pitch. Then, the feed pitch of the second motor 114 is changed to 2-pitch and the feed pitch of the third motor 115 is changed to 1-pitch. At the same time, the motor 120 is driven to move the movable plate 118 rightward to the position as indicated by the two-dot chain lines in FIG. 11. Thus, the above operation, the space $X_1$ of the second process J is extended to a space $X_2$, and the space $Y_1$ of the third process K is thereby reduced to a space $Y_2$. This change of space is required because the process having a great feed pitch necessitates a large space in order to process a greater amount of workpieces simultaneously, whereas a small space is enough for the process having a small feed pitch. The construction as described above leads to a high space utilization as well as the capability of coping with change of feed pitch.

Although the movable plate 118 in the second embodiment is provided with two pulleys (buffer pulley 116 and guide pulley 117) as buffer means, it may be provided with three pulleys in the same manner as the buffer means 22 or 23 in the first embodiment.

Figure 14:
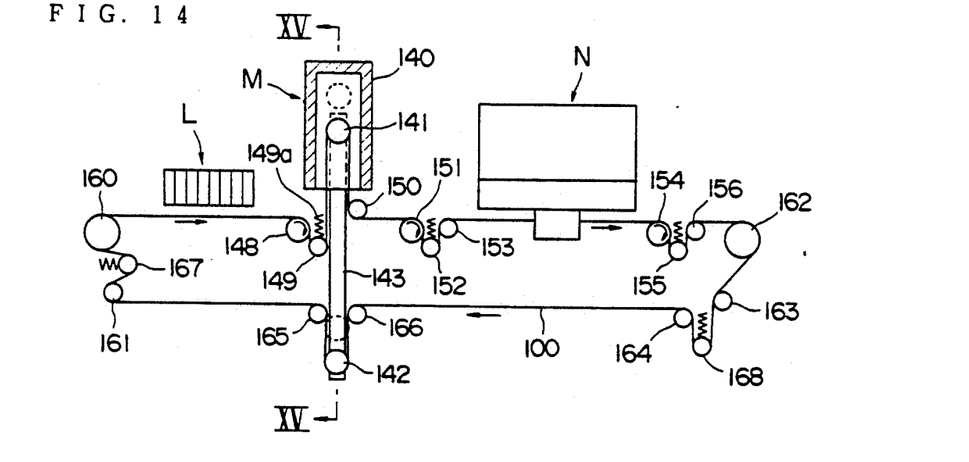
FIG. 14 is a schematic front view of a conveyor equipment in accordance with a third embodiment of the present invention.
Figure 15:
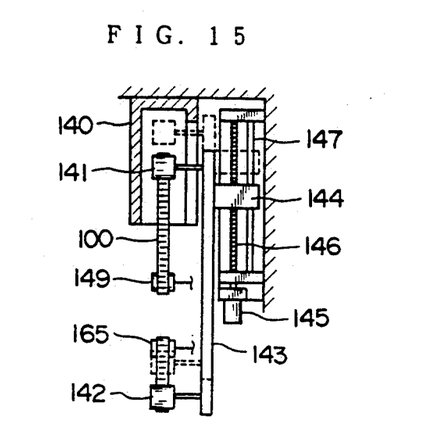
FIG. 15 is a section view of the conveyor equipment taken along the line XV—XV in FIG. 14.

FIGS. 14 and 15 show schematic views of a conveyor equipment in accordance with a third embodiment of the present invention.

The conveyor equipment of the present embodiment comprises a first process L, a second process M and a third process N. A timing belt 100 having the same construction as that in the second embodiment is provided. The second process M employs a vertical furnace 140 such as a heat treating furnace or an ultraviolet ray irradiating furnace in which a support pulley 141 for supporting the internal surface of the forwarding portion of the timing belt 100 is inserted. Support pulley 141, being movable vertically, is rotatably mounted to the front surface of the uppermost end portion of the lift plate 143. To the front surface of the of the lift plate 143. Pressor pulley 142, for pressing the belt 100, is rotatably mounted to the front surface of the lowermost end portion of the lift plate 143. As shown in FIG. 15, a nut member 144 is fixed to the rear surface of the lift plate 143. This nut member 144 engaged with a ball screw 146 is driven by a lift motor 145 and vertically guided by a guide rail 147. When the lift motor 145 is driven, the lift plate 143 is moved vertically by the ball screw 146, therefore the support pulley 141 and the, pressor pulley 142 can be moved vertically in unison.

A buffer pulley 149 is arranged forward of the lift plate 143, and a pressor pulley 150 is arranged after the lift plate 143. Before the buffer pulley 149, there is a drive pulley 148 which determines the feed pitch of the timing belt 100 passing through the first process L. The buffer pulley 149 is vertically movable and urged by a spring 149a so as to apply a constant tension force to the timing belt 100, thereby absorbing excessive tension or slackening applied to the timing belt 100 by the vertical movement of the lift plate 143.

After pressor pulley 150 there are a drive pulley 151, a buffer pulley 152, and a guide pulley 153. The drive pulley 151 determines the feed pitch of the timing belt 100 passing through the vertical furnace 140. Furthermore, after the third process N, there are a drive pulley 154, a buffer pulley 155, and a guide pulley 156. The drive pulley 154 determines the feed pitch of the timing belt 100 passing through the third process N.

It is to be noted that the numerals 160 through 166 denote guide pulleys, and the numerals 167 and 168 denote tension pulleys.

If the processing time of the vertical furnace 140 in the above-mentioned embodiment needs to be change it is only necessary to move the lift plate 143 vertically. For instance, by moving the lift plate 143 upwardly, the length of the timing belt 100 inside of the vertical furnace 140 is increased, because the workpiece stays inside of the vertical furnace 140 for a longer time. If the length of the forwarding portion of the timing belt 100 is insufficient to raise lift plate 143 as described above, the insufficiency in length may be compensated with the pressor pulley 142 for the returning portion of the timing belt 100.

Although the support pulley 141 and the pressor pulley 142 are mounted commonly to the lift plate 143 in the above-mentioned embodiment, the construction is not so limited. For example, it is possible that only the support pulley 141 is mounted to the lift plate 143 whereas the pressor pulley 142 is omitted.

The present invention is not restricted to the aforesaid embodiments and includes a variety of modifications within the scope of the present invention.

Figure 16:
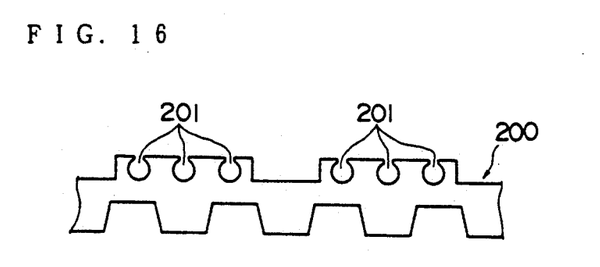
FIG. 16 is a side view of workpiece conveyance means in accordance with another embodiment of the present invention.

Instead of using magnetic force to retain a workpiece 5 on the timing belt 100, as shown in FIG. 16, retainer grooves 201 having narrow openings may be formed on the external surface of the timing belt 200 to retain the lead terminals of an electronic component. In order to take out the lead terminals from the retainer grooves 201, the timing belt 200 can be bent so that the external surface of the belt become convex, thereby widening the openings of the retainer grooves 201, or, alternatively the electronic component may be pulled sideward from the timing belt. Further, retainer holes having no openings may be formed widthwise in the timing belt.

Figure 17:
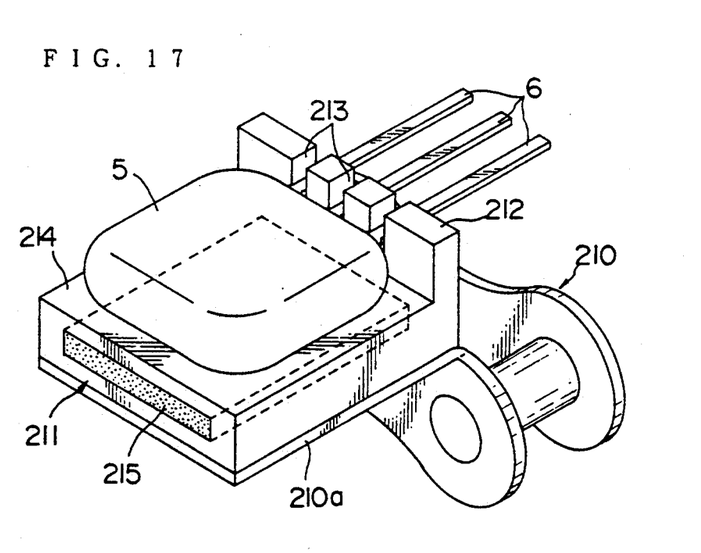
FIG. 17 is a perspective view of workpiece conveyance means in accordance with yet another embodiment of the present invention.

Instead of a timing belt, a chain 210 having attachments 210a as shown in FIG. 17 may be used to mount a workpiece holder 211. The workpiece holder 211 is made of a non-magnetic insulating material with an upright rib 212 provided at a side portion thereof. This rib 212 is formed with retainer grooves 213 into which the lead terminals 6 of an electronic component 5 can be inserted to be retained. At an upper portion of the workpiece holder 211, there is formed a carrier surface 214 for carrying the body of the electronic component 5, and a permanent magnet 215 is embedded in the holder 211. With the above construction, the lead terminals 6 of the electronic component 5 are attracted to the carrier surface 214 by the permanent magnet 215, whereby the electronic component 5 can be held stably in the workpiece holder 211 against any inertial force possibly generated either when the timing belt is driven intermittently or when the feed direction is changed.

It is to be noted that the construction of the workpiece holder is not limited to the construction of the above-mentioned embodiment where the retainer grooves 213 for retaining the lead terminals 6 are provided. For example, a workpiece holder may be provided with both a recess portion for storing the body of an electronic component 5 and a permanent magnet embedded under the recess portion.

It is also to be noted that the workpiece of the present invention is not limited to an electronic component. Also, the electronic component is not limited to a radial-lead component having plate-type lead terminals. Any radial-lead component having round-bar type lead terminals, any chip component having magnetic external electrodes, and any electronic component having a magnetic casing are acceptable. For instance, in order to convey a chip component having magnetic caps on both sides, a recess portion to hold the chip component may be provided at a constant pitch on the external surface of a timing belt, or may be formed on a workpiece holder.

A belt having perforations provided at a certain pitch may be selected as the workpiece conveyance means instead of a timing belt or a chain. Any of these conveyance means is suitable for intermittently feeding a workpiece with positional precision. In order to retain a workpiece on the workpiece conveyance means, a workpiece holder may be attached to a timing belt or to a belt with perforations instead of forming integral retainer grooves integrally on the external surface of a timing belt.

The magnet means is not limited to a permanent magnet, an electromagnet may be used instead. It is easy to mount an electromagnet instead of the permanent magnet, particularly to stable rails.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. Apparatus for conveying a workpiece having a magnetic portion, said apparatus comprising:
   an endless belt having internal teeth at a constant pitch on an internal surface thereof;
   workpiece retaining means provided at a constant pitch on said belt, said workpiece retaining means being for retaining thereon said magnetic portion of said workpiece and positioning said workpiece in a feed direction of said belt;
   drive means for driving said belt at a constant pitch, said drive means comprising a drive pulley having teeth to be engaged with said internal teeth of said belt; and a guide rail for slidably guiding said belt, said guide rail comprising a magnet which attracts said magnetic portion of said workpiece toward said workpiece retaining means.

2. Apparatus as claimed in claim 1, wherein said workpiece is a radial-lead component having a plurality of magnetic lead terminals arranged in parallel, and wherein said workpiece retaining means comprises retainer grooves formed widthwise at a constant pitch on an external surface of said belt for retaining therein said lead terminals.

3. Apparatus as claimed in claim 2 wherein said guide rail further comprises:
a first yoke and a second yoke disposed to form a magnetic circuit between said magnet, said first yoke, said magnetic lead terminals and said second yoke, thereby attracting said magnetic lead terminal as toward said retainer grooves at a place where said belt is slidably guided by said guide rail.

4. Apparatus as claimed in claim 2 wherein said at least one drive pulley further comprises:
a pulley magnet which attracts said magnetic lead terminals toward said retainer grooves at a place where said internal teeth of said belt are engaged with said teeth of said drive pulley.

5. Apparatus as claimed in claim 4 wherein said at least one drive pulley further comprises:
a first yoke and a second yoke disposed to form a magnetic circuit between said pulley magnet, said first yoke, said magnetic lead terminals and said second yoke, thereby attracting said magnetic lead terminals toward said retainer grooves at a place where said internal teeth of said belt are engaged with said teeth of said drive pulley.

6. Apparatus for conveying a radial-lead component having a plurality of magnetic lead terminals arranged in parallel, said apparatus comprising:
an endless belt having internal teeth at a constant pitch on an internal surface thereof;
retainer grooves formed widthwise at a constant pitch on an external surface of said belt to retain said lead terminals;
a guide rail for slidably guiding said belt, said guide rail comprising a magnet which attracts said lead terminals toward said retainer grooves;
a plurality of drive means for driving said belt at respective rates of conveyance, each of said drive means comprising a drive pulley having teeth to be engaged with said internal teeth of said belt; and
buffer means for absorbing temporary differences in respective rates of conveyance between said drive means.

7. Apparatus as claimed in claim 6, wherein said buffer means comprises:
a lift member which is movable vertically;
a support pulley for supporting an internal surface of said timing belt, said support pulley being rotatably mounted to said lift member and being provided on an entire periphery thereof with a magnet for attracting said lead terminals toward said retainer grooves;
a pair of rails for slidably guiding said belt being vertically provided at both sides of said lift member and being provided with magnets for attracting said lead terminals toward said retainer grooves;
urging means for urging said lift member upward with a force greater than the weight of said lift member including said support pulley; and
a pair of pressor pulleys for pressing an external surface of said belt, said pressor pulleys being rotatable and being provided upstream and downstream of said lift member.

8. Apparatus as claimed in claim 6 wherein said guide rail further comprises:
a first yoke and a second yoke disposed to form a magnetic circuit between said magnet, said first yoke, said magnetic lead terminals and said second yoke, thereby attracting said magnetic lead terminals toward said retainer grooves at a place where said belt is slidably guided by said guide rail.

9. Apparatus as claimed in claim 6 wherein said drive pulley further comprises:
a pulley magnet which attracts said magnetic lead terminals toward said retainer grooves at a place where said internal teeth of said belt are engaged with said teeth of said drive pulley.

10. Apparatus as claimed in claim 9 wherein said drive pulley further comprises:
a first yoke and a second yoke disposed to form a magnetic circuit between said pulley magnet, said first yoke, said magnetic lead terminals and said second yoke, thereby attracting said magnetic lead terminals toward said retainer grooves at a place where said internal teeth of said belt are engaged with said teeth of said drive pulley.

11. Apparatus for conveying a workpiece, said apparatus comprising:
an endless belt having internal teeth at a constant pitch on an internal surface thereof;
retaining means for retaining said workpiece on said belt;
a plurality of drive means for driving said belt at respective rates of conveyance, each of said drive means comprising a drive pulley having teeth to be engaged with said internal teeth of said belt; and
buffer means for absorbing temporary differences in respective rates of conveyance between said drive means, said buffer means comprising
a lift member which is movable vertically;
a support pulley for supporting said internal surface of said belt, said support pulley being rotatably mounted to said lift member;
urging means for urging said lift member upward with a force greater than the weight of said lift member including said support pulley; and
a pair of pressor pulleys for pressing an external surface of said belt, said pressor pulleys being rotatable and being provided upstream and downstream of said lift member.

* * * * *